United States Patent
Lee et al.

(10) Patent No.: US 6,707,108 B2
(45) Date of Patent: Mar. 16, 2004

(54) TRANSIENT VOLTAGE SUPPRESSOR STRUCTURE

(75) Inventors: Chun-yuan Lee, Hsin-chu (TW); Kang-neng Hsu, Hsin-chu hsien (TW)

(73) Assignee: Inpaq Technology Co., Ltd., Taipei (TW)

( * ) Notice: Subject to any disclaimer, the term of this patent is extended or adjusted under 35 U.S.C. 154(b) by 59 days.

(21) Appl. No.: 09/885,126

(22) Filed: Jun. 21, 2001

(65) Prior Publication Data

US 2002/0195689 A1 Dec. 26, 2002

(51) Int. Cl.$^7$ .................................................. H01L 23/62
(52) U.S. Cl. ........................ 257/355; 257/173; 257/782
(58) Field of Search ................................... 257/355, 173, 257/782

(56) References Cited

U.S. PATENT DOCUMENTS 4,809,044 A * 2/1989 Pryor et al. ..................... 257/3
6,013,358 A * 1/2000 Winnett et al. ............. 174/258

* cited by examiner

*Primary Examiner*—David L. Talbott
*Assistant Examiner*—Luan Thai
(74) *Attorney, Agent, or Firm*—Bacon & Thomas, PLLC

(57) ABSTRACT

A kind of transient voltage suppressor structure that prevents the edge of the signal electrode from contacting with the variable impedance material by using an insulation layer to remove the point discharge existing on the edge of the signal electrode and increase the capability of the transient voltage suppressor to sustain higher transient voltage energy.

21 Claims, 4 Drawing Sheets

TRANSIENT VOLTAGE SUPPRESSOR STRUCTURE

BACKGROUND OF THE INVENTION

This invention is related to a kind of transient voltage suppressor structure, especially to a transient voltage suppressor structure that prevents the tip on the edge of the signal electrode from contacting with functional material by using an insulation layer.

The transient voltage suppressors developed in recent years feature the embedment of a variable impedance material in their structure through which the signal electrode and the ground electrode are connected electrically. The characteristics of these variable impedance material lie in that they can change their impedance in an appropriate range of voltage. When the signal electrode is in the range of normal working voltage, the variable impedance material is in a state of high impedance, so that the voltage and current on the signal electrode in the range of normal working voltage can work appropriately and will not be conducted to the ground electrode. However, when abnormal pulse appears on the signal electrode, the variable impedance materials is shifted to a low impedance state and the energy of the pulse is conducted from the signal electrode to the ground electrode through a transient voltage suppressor and released from the ground electrode. Therefore, the voltage of the signal electrode is limited within an allowable range so that circuits can be protected through the characteristics of the variable impedance material.

There are various kinds of transient voltage suppressors that are conventionally made from variable impedance material, among which the voltage suppressor with a single layer structure is generally applied in the industry. The voltage suppressor with such structure usually has a larger volume and can sustain extreme pulse energy, such as lightning. Another voltage suppressor structure used in the industry is multi-layer structure that has a smaller volume and formed to be a surface adhesion type.

Please refer to FIG. 1. The conventional voltage suppressor structure usually has a basic substrate 100 as its matrix on which there is a signal electrode 202a, a variable impedance material 104 and a ground electrode 202b. Part of the variable impedance material 104 covers the basic substrate 100 and the rest part of it covers the signal electrode 202a, while part of the ground electrode 202b covers the basic substrate 100 and the rest part of it covers the variable impedance material 104 to form a stacked structure.

Please refer to FIG. 2. The voltage suppressor structure protected by U.S. Pat. No. 6,013,358 has a glass or ceramic basic substrate as its matrix. The density of this glass or ceramic plat 200 exceeds 3.5 g/cm$^3$ and has a pair of electrodes 202, including a signal electrode 202a and a ground electrode 202b. A variable impedance material 204 is placed between the signal electrode 202a and the ground electrode 202b. It covers the basic substrate 100 and a part of the signal electrode 202a and ground electrode 202b, so that the transient voltage can be conducted from the signal electrode 202a to the ground electrode 202b and released from the latter.

Please refer to FIG. 3. No matter whether the thin or thick film technology is applied, the thickness on the edge of the signal electrode 102a becomes thin gradually when the signal electrode 102a is formed and an included angle between the tangent of the signal electrode 102a and the horizontal line appears in a form of an acute angle. This acute angle produces point discharge easily when transient voltage appears and the energy concentrates itself for this discharge. As a result, the capability of the voltage suppressor to sustain transient voltage is restricted and affects the performance of the whole suppressor.

SUMMARY DESCRIPTION OF THE INVENTION

Therefore, the purpose of the said invention is to provide a kind of transient voltage suppressor structure that insulates the edge of the signal electrode from the variable impedance material with an insulator to remove the point discharge of the signal electrode in the transient voltage suppressor structure and increase the capability of the suppressor to sustain transient voltage.

The purpose of the said invention is to provide a kind of transient voltage suppressor structure that insulates the edge of the signal electrode from the variable impedance material with an insulator. In this way, the pulse energy is forced to distribute over the contact face of the signal electrode and the variable impedance material without concentrating onto the small area on the edge of the electrode and causing damage to the material.

A transient voltage suppressor structure is provided to accomplish the purpose of the said invention. An insulation layer is used in this structure to prevent the edge of the signal electrode from contacting with the variable impedance material and, further, remove the effect of the point discharge existing on the edge of the signal electrode. No matter whether the thin or thick film technology is applied, the thickness on the edge of the signal electrode becomes thin gradually when the signal electrode is formed and an included angle between the tangent of the signal electrode and the horizontal line appears in a form of an acute angle. This acute angle produces point discharge easily when transient voltage appears and the energy concentrates itself for this discharge. As a result, the capability of the voltage suppressor to sustain transient voltage is restricted. The said invention is a structure that insulates the edge of the signal electrode from the variable impedance material with an insulator to increase the capability of the transient voltage suppressor to sustain transient voltage.

To easily understand the purposes, characteristics and advantages of the said invention, a preferred embodiment with figures is described in detail as follows:

BRIEF DESCRIPTION OF NUMERALS

Figure 1:
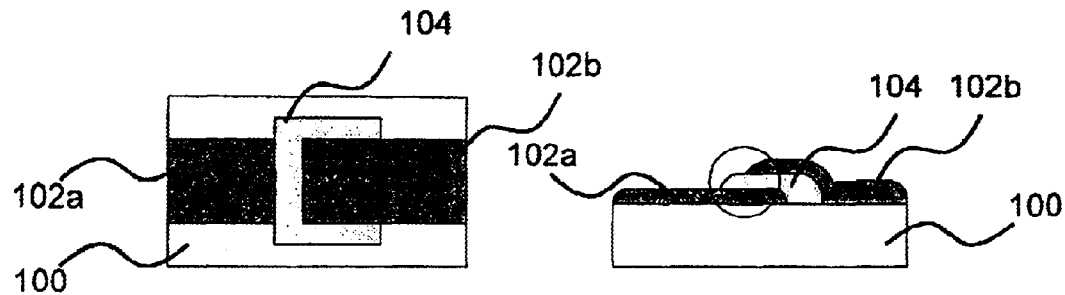
FIG. 1 and FIG. 2 are the sectional schematic drawings of the conventional transient voltage suppressor structures.
Figure 2:
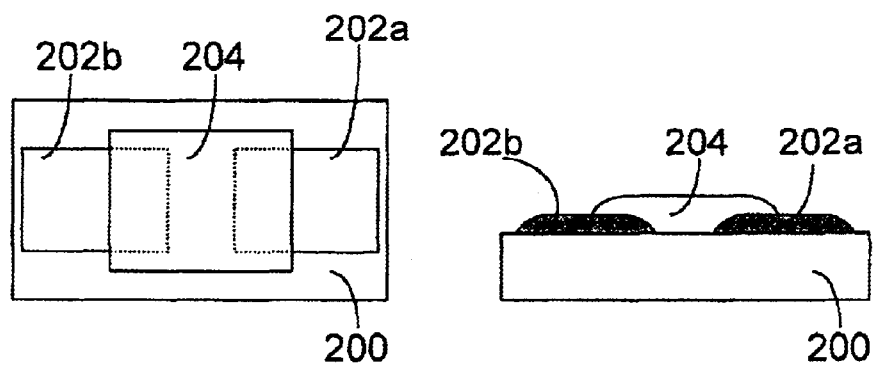
Figure 3:
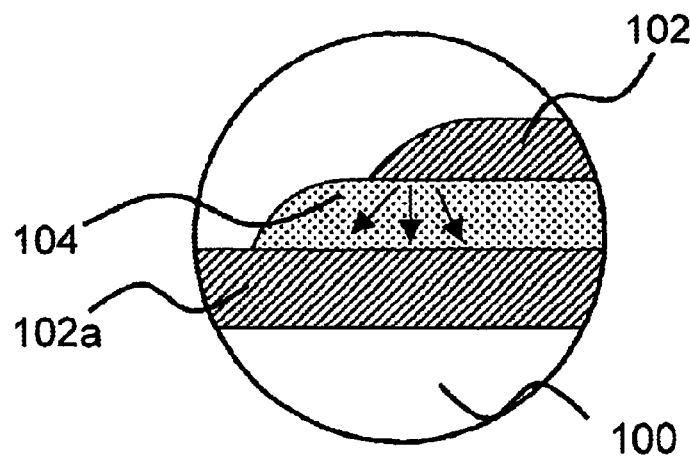
FIG. 3 is the local magnification drawing of the contact face between the edge of the signal electrode and the variable impedance material shown in FIG. 1.
Figure 4:
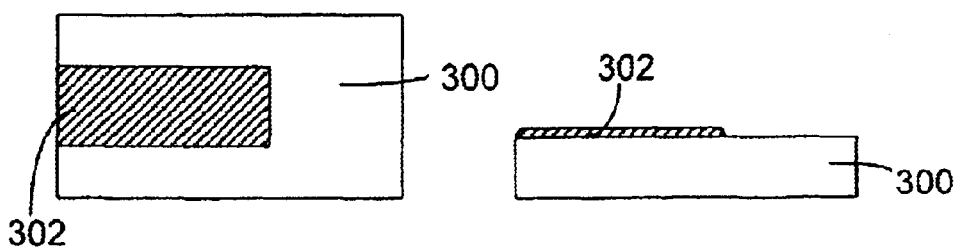
FIG. 4 to FIG. 7 are the manufacturing flowcharts of the transit voltage suppressor used in a preferred embodiment of the said invention.

100, 200: Basic substrate
102, 202: Electrode 102a, 102b: Ground electrode
102b, 202b: Signal electrode
300: Basic Substrate
302: Ground electrode
304: Variable impedance material
306: Insulation layer
308: Signal electrode

DETAILED DESCRIPTION OF PREFERRED EMBODIMENT

The purpose of transient voltage suppressors is mainly to protect electronic equipment from being damaged by pulse. Because the instant energy of pulse is very strong, electronic equipment is generally not able to sustain such huge energy impact and needs the protection of transient voltage suppressors. To accomplish this purpose, the transient voltage suppressor must have the capability to sustain the impact brought by the pulse and its design must meet this requirement.

Please refer to FIG. 4 to FIG. 7. The drawings show the manufacturing flowcharts of the transient voltage suppressor used in a preferred embodiment of the said invention. A basic substrate 300 is provided in FIG. 4 and this basic substrate 300 can be, for example, a glass or a ceramic basic substrate. At least a ground electrode 302 is formed on the basic substrate 300 and this ground electrode 302 is formed, for example, with deposition or sputtering technology and then in the lithography and etching process for patterning.

Figure 5:
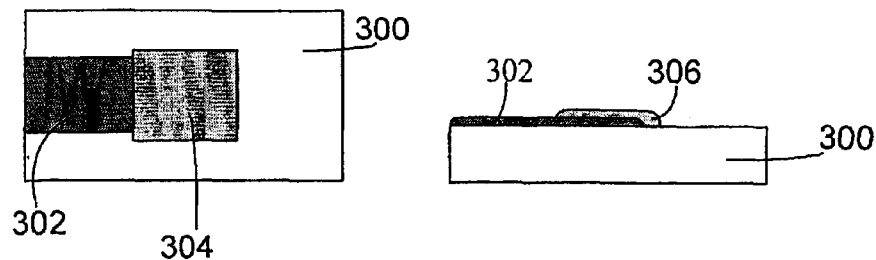

Further please refer to FIG. 5. a variable impedance material 304 is formed at one end of the ground electrode 302 and this variable impedance material 304 is made, for example, from conductor and semiconductor powder evenly mixed with a material containing binder. This kind of material have been published in many patent documents, such as U.S. Pat. Nos. 3,685,026, 3,685,028, 4,977,357, 5,068,634, 5,260,848, 5,294,374, 5,393,596 and 5,807,509.

Figure 6:
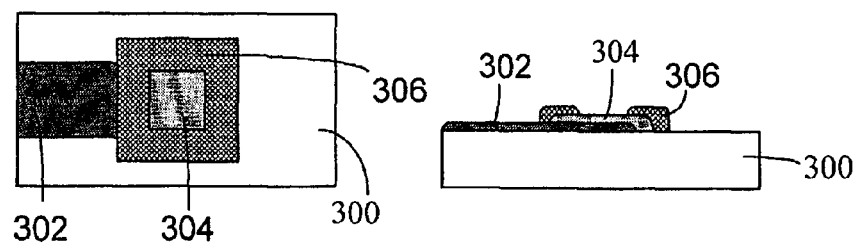

Further please refer to FIG. 6. An insulation layer 306 is formed and covers the edge of the variable impedance material 304 and forms a box structure. However, the structure of the insulation layer 306 is not limited to the box shape; it changes along with the profile of the variable impedance material 304. Besides, the insulation layer 306 will expose the central part of the variable impedance material 304 so that it can connect with the consequently formed signal electrode 308 (see FIG. 7) electrically.

Figure 7:
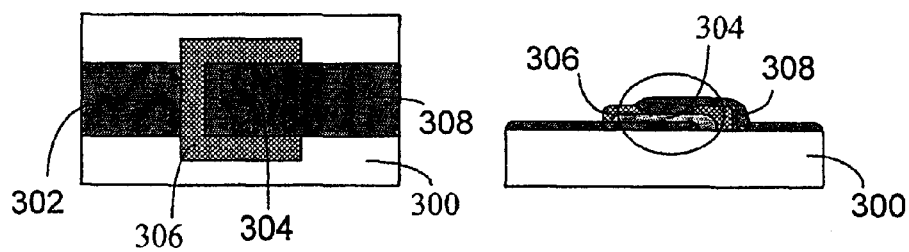
Figure 8:
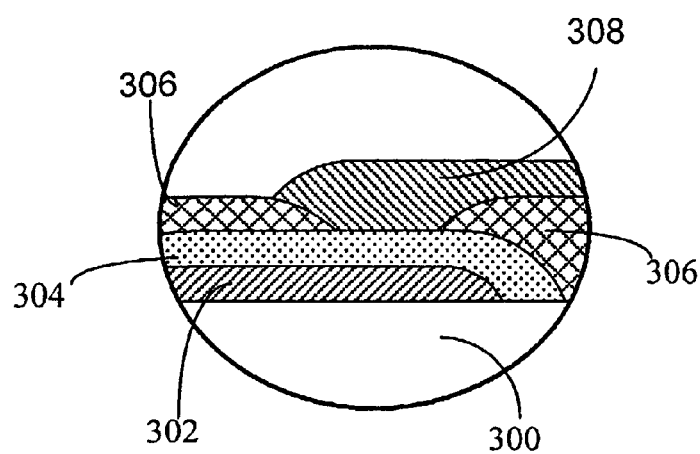
FIG. 8 is the local magnification drawing of the contact face between the edge of the signal electrode and the variable impedance material shown in FIG. 7.

Further please refer to both FIG. 7 and FIG. 8. A signal electrode 308 is formed on the variable impedance material 304 to ensure that its edge locates on the insulation layer 306. The whole signal electrode 308 extends, for example, from the contact part with the variable impedance material 304 to the basic substrate 300. FIG. 8 shows clearly that the edge of the signal electrode 308 can be maintained precisely on the insulation layer 306 in the lithography and etching process so that, instead of on the edge of the signal electrode 308, the point discharge occurs on the contact face of the signal electrode 308 and the variable impedance material 304. The point discharge on the edge of the signal electrode 308 can be removed effectively in this way.

Figure 9:
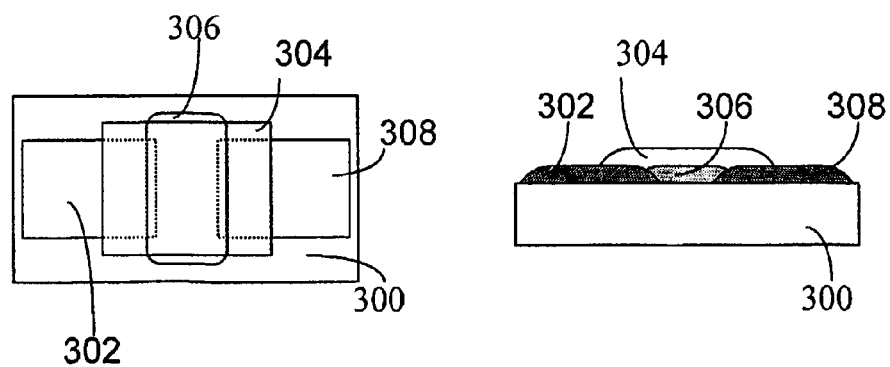
FIG. 9 is the schematic drawing of the transient voltage suppressor structure used in another preferred embodiment of the said invention.

Finally, please refer to FIG. 9 presenting the schematic drawing of the transient voltage suppressor structure used in another preferred embodiment of the said invention. The transient voltage suppressor contains mainly a basic substrate 300, a ground electrode 302, a variable impedance material 304, a insulation layer 306 and a signal electrode 308. The ground electrode 302 and the signal electrode 308 are placed on the basic substrate 300, the insulation layer 306 is placed on the basic substrate 300 between the signal electrode 308 and the ground electrode 302, while the variable impedance material 304 is placed on the top of the insulation layer 306 between the signal electrode 308 and the ground electrode 302 and connects with the signal electrode 308 and the ground electrode 302 electrically.

Please also refer to FIG. 8. The insulation layer 306 covers the edge of the signal electrode 308 and connects with the signal electrode 308 and the ground electrode 302 electrically through the variable impedance material 304. In doing so, the transient voltage suppressor can effectively remove the point discharge occurring on the edge of the signal electrode and prevent the permanent damage to the voltage suppressor.

FIG. 7 and FIG. 8 show that the transient voltage suppressor structure can be integrated in various electronic components. Because the voltage suppressor can sustain higher pulse impact, the electronic components can be protected more effectively and improved not only in their performance, but also in their life. Besides, thanks to the formation of the insulation layer, the variable impedance material of the suppressor itself is also protected. This can not only improve the performance of the voltage suppressor, but also increase its life.

Based on the aforementioned description, the invented transient voltage suppressor structure has at least the following advantages:

1. Because the edge of the signal electrode only contact with the insulation layer, the point discharge does not occur on the edge of the signal electrode when the invented transient voltage suppressor, but on the contact face of the signal electrode and the variable impedance material. The problem of the point discharge on the edge of the signal electrode can be solved in this way.

2. The invented transient voltage suppressor does not suffer permanent damage caused by the concentration of pulse energy in the edge area of the signal electrode. The pulse energy is controlled so that it flows only through the contact face of the signal electrode and the variable impedance material. In doing so, the invented transient voltage suppressor structure not only reduces the probability of the damage to the variable impedance material caused by the pulse, but also improves the capability of components to sustain pulse energy.

The said invention is presented with a preferred embodiment as described above, but it shall not be deemed the application of the said invention is limited to such embodiment. All the people who are familiar with this technique may undertake any change and modification within the spirit and scope of the said invention. Therefore, the protection scope of the said invention shall be determined based on the definition stated in the following CLAIM.

What I claim is:

1. A transient voltage suppressor structure applicable to electronic components which includes:
    a basic substrate;
    a conductive ground electrode that is placed on the basic structure,
    a variable impedance material that is placed on a portion of the conductive ground electrode,
    an insulation layer that is placed on the variable impedance material and exposes a partial area of the variable impedance material; and
    a conductive signal electrode that is placed on the insulation layer and the exposed variable impedance material and connects with the variable impedance material.

2. The transient voltage suppressor structure as claimed in claim 1, wherein the basic substrate is a glass.

3. The transient voltage suppressor structure as claimed in claim 1, wherein the basic substrate is a ceramic material.

4. The transient voltage suppressor structure as claimed in claim 1, wherein a contact face exists between the variable impedance material and the signal electrode to conduct the transient voltage to the ground electrode.

5. The transient voltage suppressor structure as claimed in claim 1 wherein the insulation layer can prevent the point discharge occurring on the edge of the signal electrode.

6. The transient voltage suppressor structure as claimed in claim 1, wherein the insulation layer is made from a material with low dielectric constant which is an oxide or metallic oxide.

7. The transient voltage suppressor structure as claimed in claim 1, wherein the structure of the insulation layer conforms to the profile of the variable impedance material.

8. A transient voltage suppressor structure applicable to electronic components which includes:
   a basic substrate;
   a signal electrode and a ground electrode that are placed on the basic substrate;
   an insulation layer that is placed on the basic substrate between the signal electrode and the ground electrode;
   a variable impedance material that is placed on the insulation layer between the signal electrode and the ground electrode and connects with the signal electrode and the ground electrode through the variable impedance material.

9. The transient voltage suppressor structure as claimed in claim 8, wherein the basic substrate is a glass or a ceramic basic substrate.

10. The transient voltage suppressor structure as claimed in claim 8, wherein a contact face exists between the variable impedance material and the signal electrode to conduct the transient voltage to the ground electrode.

11. The transient voltage suppressor structure as claimed in claim 8. wherein the insulation layer covers the edge of the signal electrode to prevent the effect of the point discharge occurring ion the edge of the signal electrode.

12. The transient voltage suppressor structure as claimed in claim wherein the insulation layer is made from material with low dielectric constant which is an oxide or metallic oxide.

13. A transient voltage suppressor structure applicable to electronic components which includes:
   a basic substrate;
   a signal and ground electrode placed on the basic substrate;
   an insulation layer placed between the signal electrode and the ground electrode;
   a variable impedance material placed between the signal electrode and the ground electrode;
   the characteristics of the said transient voltage suppressor structure lie in that the edge of the signal electrode is covered by the insulation layer and the transient voltage is conducted to the ground electrode through the contact face of the variable impedance material and the signal electrode.

14. The transient voltage suppressor structure as claimed in claim 13, wherein the variable impedance material is placed on one end of the ground electrode while the insulation layer is placed on the edge of the variable impedance material and exposes the central part of the variable impedance material. One end of the signal electrode is placed on the insulation layer and the exposed variable impedance material.

15. The transient voltage suppressor structure as claimed in claim 14, wherein the insulation layer is formed in a box structure.

16. The transient voltage suppressor structure as claimed in claim 14, wherein the Structure of the insulation layer is in conformity with the profile of the variable impedance material.

17. The transient voltage suppressor structure as claimed in claim 13, wherein the insulation layer is formed in a box structure.

18. The transient voltage suppressor structure as claimed in claim 13, wherein the structure of the insulation layer is in Conformity with the profile of the variable impedance material.

19. The transient voltage suppressor structure as claimed in claim 13, wherein the insulation layer is placed on the basic substrate between the signal electrode and the ground electrode to cover the signal electrode, while the variable impedance material is placed on the insulation layer between the signal electrode and the ground electrode and connects with the signal electrode and the ground electrode electrically.

20. The transient voltage suppressor structure as claimed in claim 13, wherein the basic substrate is a glass or ceramic basic substrate.

21. The transient voltage suppressor structure as recited in claim 13, wherein the insulation layer is made from a material with tow dielectric constant which is an oxide or metallic oxide.

* * * * *